United States Patent
Darveaux

(10) Patent No.: US 6,400,033 B1
(45) Date of Patent: Jun. 4, 2002

(54) REINFORCING SOLDER CONNECTIONS OF ELECTRONIC DEVICES

(75) Inventor: Robert F. Darveaux, Higley, AZ (US)

(73) Assignee: Amkor Technology, Inc., Chandler, AZ (US)

(*) Notice: Subject to any disclaimer, the term of this patent is extended or adjusted under 35 U.S.C. 154(b) by 0 days.

(21) Appl. No.: 09/585,506

(22) Filed: Jun. 1, 2000

(51) Int. Cl.[7] ............................................. H01L 29/40
(52) U.S. Cl. .................. 257/778; 257/668; 257/688; 257/737; 257/738; 257/779
(58) Field of Search ................... 257/778, 779, 257/780, 782, 784, 786, 737, 738, 668, 670, 671, 676, 688

(56) References Cited

U.S. PATENT DOCUMENTS

| | | | |
|---|---|---|---|
| 5,455,390 A | 10/1995 | DiStefano et al. | 174/262 |
| 5,579,573 A | 12/1996 | Baker et al. | 29/840 |
| 5,625,222 A * | 4/1997 | Yoneda et al. | 257/687 |
| 5,656,862 A | 8/1997 | Papathomas et al. | 257/778 |
| 5,677,246 A | 10/1997 | Maeta et al. | 437/209 |
| 5,796,169 A * | 8/1998 | Dockerty et al. | 257/780 |
| 5,843,251 A | 12/1998 | Tsukagoshi et al. | 156/64 |
| 5,847,456 A * | 12/1998 | Shoji | 257/737 |
| 5,859,475 A | 1/1999 | Freyman et al. | 257/738 |
| 5,973,404 A | 10/1999 | Akram et al. | 257/778 |
| 5,998,242 A | 12/1999 | Kirkpatrick et al. | 438/127 |
| 6,063,649 A | 5/2000 | Yoshino | 438/118 |
| 6,111,324 A | 8/2000 | Sheppard et al. | 257/787 |
| 6,140,402 A | 10/2000 | Dietz et al. | 524/403 |
| 6,188,582 B1 * | 2/2001 | Peter | 361/760 |

FOREIGN PATENT DOCUMENTS

JP 09186198 A * 7/1997

* cited by examiner

Primary Examiner—Nathan Flynn
Assistant Examiner—Remmon R. Fordé
(74) Attorney, Agent, or Firm—Skjerven Morrill LLP; James E. Parsons

(57) ABSTRACT

A method and apparatus for reinforcing the solder connections between a semiconductor device and a substrate includes the provision of a rigid frame having a central opening through it, a planar top surface, a bottom surface opposite and parallel to the top surface, and a thickness between the two surfaces to equal to the height of the solder connections. The top surface of the frame is attached to the bottom surface of the semiconductor device at the peripheral edges thereof and outside of a plurality of input/output terminals thereon. The bottom surface of the frame is attached to the top surface of the substrate. The frame reinforces the solder connections between a C4-mounted semiconductor die or a C5-mounted semiconductor package and a substrate against the stresses acting on the connections with bending of the PCB.

26 Claims, 1 Drawing Sheet

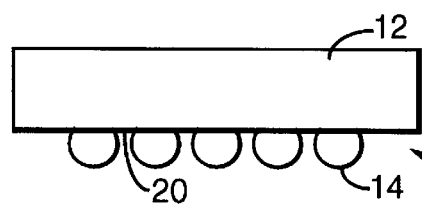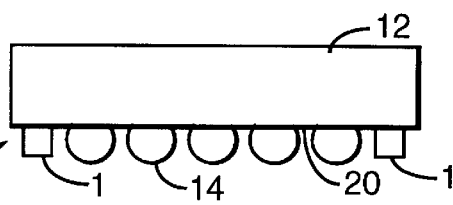
FIG. 1 (PRIOR ART)    FIG. 6
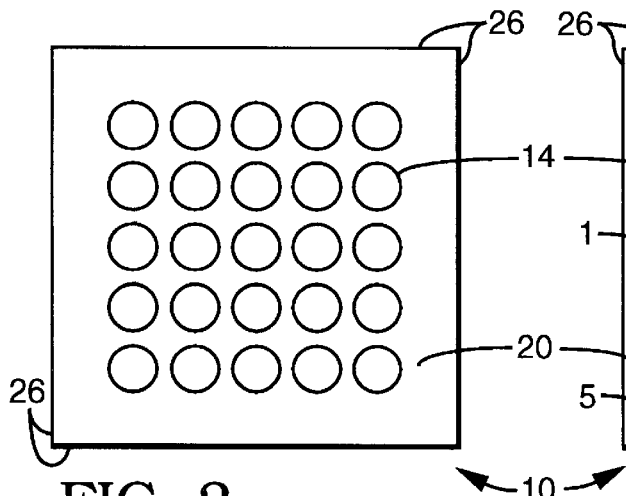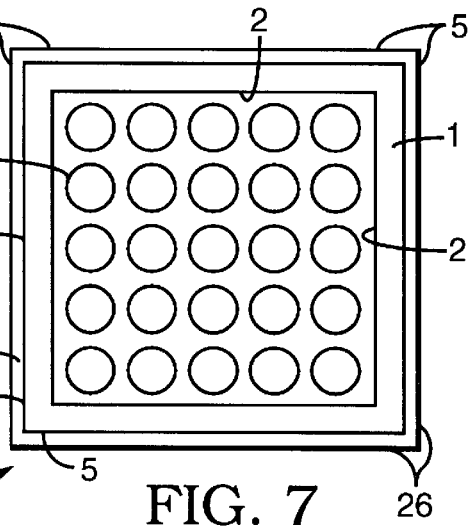
FIG. 2 (PRIOR ART)    FIG. 7
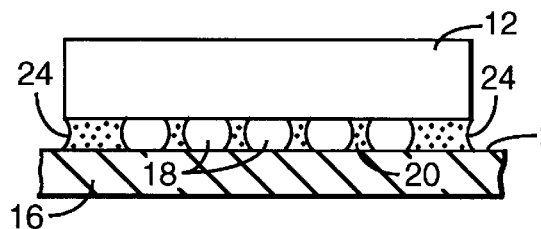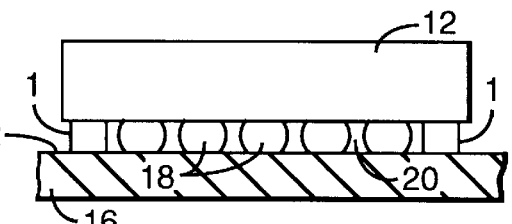
FIG. 3 (PRIOR ART)    FIG. 8
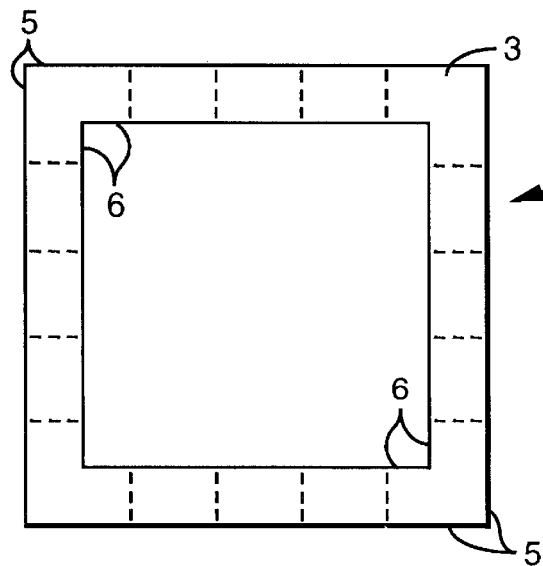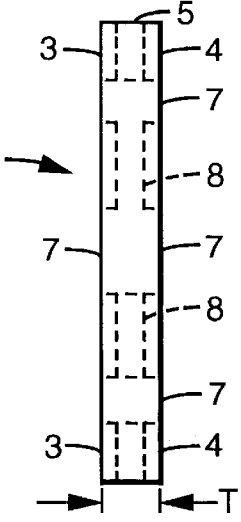
FIG. 4    FIG. 5

REINFORCING SOLDER CONNECTIONS OF ELECTRONIC DEVICES

BACKGROUND

1. Technical Field

This invention relates generally to semiconductor packaging and mounting, and particularly, to a method and apparatus for reinforcing the solder connections of semiconductor devices.

2. Related Art

An increasing demand for electronic equipment that is smaller, lighter, and more compact has resulted in a concomitant demand for semiconductor packages that have smaller outlines and mounting "footprints."

One response to this demand has been the development of so-called "chip-size," or "chip-scale" semiconductor packages ("CSPs"), i.e., packages that are virtually the same size as the integrated circuit ("IC") die, or "chip," packaged therein.

Another response has been the development of the so-called "flip-chip" method of attachment of semiconductor chips to substrates. Sometimes referred to as the "Controlled Collapse Chip Connection," or "C4," method, the technique involves forming balls of a conductive metal, e.g., solder or gold, on the input/output pads on the active surface of the chip, then inverting, or "flipping" the chip over and "reflowing" the conductive balls, i.e., heating them to the melting point, to fuse them to corresponding connection pads on a substrate.

Yet another response has been the development of so-called ball grid array ("BGA"), land grid array ("LGA"), and lead-less chip carrier ("LCC") versions of CSPs that "surface mount" to an associated printed circuit board ("PCB") with solder connections, and that have a mounting footprint equal to the outline of the package. The BGA package, for example, mounts and electrically connects to a PCB with a plurality of solder balls in a manner similar to that used for the fli-chip mounting of a semiconductor chip to a substrate described above, and is sometimes referred to as the "C5" method.

While these types of die and package mounting and connection techniques have provided a satisfactory response to the demand for smaller packages having lower profiles and smaller mounting footprints, their use in certain applications has resulted in some problems. In particular, where a C4 or a C5 method is used to mount and connect a die or a semiconductor package to a substrate that is subject to repeated and/or excessive bending or flexure, such as in portable devices, e.g., laptops, cellular phones, and calculators, the repeated bending of the substrate results in stresses in the solder connections between the package and the substrate that can cause the connections to fail and thereby result in equipment malfunctions.

One solution to this problem has been to "underfill" the narrow space between the bottom surface of the die or package and the surface of the substrate upon which the die or package mounts with a liquid epoxy resin that, when cured, forms a rigid structure that prevents or resists local bending of the substrate, and hence, the stresses on the solder connections associated therewith. However, the underfill process is relatively complex and expensive, and is considered a "non-standard" process for a typical surface-mount assembly line, especially since the spaces between the packages and the PCB must be underfilled one at a time.

Hence, a reliable, inexpensive method and apparatus are needed for reinforcing the solder connections of C4-mounted dies and C5-mounted semiconductor packages.

BRIEF SUMMARY

This invention provides a reliable method and apparatus for reinforcing the solder connections between a C4-mounted semiconductor die or a C5-mounted semiconductor package and a substrate to which the die or package is mounted. The method includes the provision of a rigid frame having a central opening through it. The frame has a planar top surface, a bottom surface opposite and parallel to the top surface, and a controlled thickness between the top and bottom surfaces that is equal to the distance between the bottom surface of the die or package and the substrate to which the die or package is mounted.

In one embodiment, the top surface of the frame is attached to a bottom surface of a die or a semiconductor package at the peripheral edges thereof and outside of the plurality of input/output terminals thereon.

The bottom surface of the frame is attached to the top surface of the substrate to which the die is mounted, or in the case of a semiconductor package, to the surface of the PCB to which the package is mounted. In one embodiment, the bottom surface of the frame is bonded to the substrate or PCB with a heat-curing adhesive, or is reflowed thereto simultaneously with the C4 solder connection of the die to the substrate, or the C5 solder connection of the semiconductor package to the PCB, respectively.

The rigid frame is thus sandwiched between the die or package and the substrate, and serves to reinforce the C4 or C5 solder connections between the die or the package and the substrate against the stresses acting on the connections with flexure of the substrate, thereby eliminating the need to underfill the die or package.

A better understanding of the above and other features and advantages of the invention may be had from a consideration of the detailed description below of some exemplary embodiments thereof, particularly if such consideration is made in conjunction with the appended drawings.

BRIEF DESCRIPTION OF THE DRAWINGS

FIG. 1 is a side elevation view of a semiconductor die or a BGA semiconductor package having a plurality of solder balls on a bottom surface thereof;

FIG. 2 is a bottom plan view of the die or BGA package shown in FIG. 1;

FIG. 3 is a side elevation view of the die or BGA package shown in FIGS. 1 and 2 mounted on a substrate or a PCB, respectively, using the conventional method and apparatus;

FIG. 4 is a top plan view of a frame for reinforcing the C4 or C5 solder connections between a semiconductor die or package and a substrate in accordance with one embodiment of the present invention;

FIG. 5 is a side elevation view of the reinforcing frame shown in FIG. 4;

FIG. 6 is a side elevation view of a semiconductor die or a BGA semiconductor package having the novel frame shown in FIGS. 4 and 5 mounted on the bottom surface thereof;

FIG. 7 is a bottom plan view of the die or BGA package shown in FIG. 6; and,

FIG. 8 is a side elevation view of the die or BGA package shown in FIGS. 6 and 7 mounted on a substrate or a PCB, respectively, in accordance with one embodiment of the present invention.

DETAILED DESCRIPTION

A semiconductor die, or alternatively, a conventional BGA semiconductor package, is illustrated in FIGS. 1 and 2 and indicated by the reference numeral 10. Although the present invention is illustrated and described herein with reference to a BGA-type of package, it should be understood that the invention can be used advantageously with other types of surface-mount semiconductor packages as well, e.g., LCC- and LGA-types of packages.

In the case of a semiconductor die 10 that is to be connected to a substrate 16 using the flip chip, or C4, method, an array of solder balls 14 are first formed on input/output lands, or pads (not illustrated), on the bottom, or "active," surface 20 of the die. The solder balls 14 serve as the input/output terminals of the die 10, and are used in the C4 method to mount and electrically connect the die to corresponding pads (not illustrated) on the substrate 16 in a plurality of solder connections 18, as illustrated in FIG. 3. The substrate 16 may comprise a flexible resin tape, a rigid fiberglass/copper sheet laminate, a ceramic coupon, or a metal lead frame, all of which are substrate types known in the industry, depending on the particular type of semiconductor package being fabricated.

In the case of a BGA package 10 that is to be connected to a PCB 16 using the C5 method, at least one semiconductor die (not illustrated) is first mounted on a substrate and electrically connected to it using, e.g., the C4 method described above, or alternatively, a wire bonding method. The die and substrate are then "overmolded," or encapsulated, typically with a filled epoxy resin plastic body, or "mold cap" 12, to protect them against harmful environmental elements, particularly moisture.

An array of solder balls 14 are then attached to input/output terminals, or lands (not illustrated) formed on the bottom surface 20 of the package 10. The solder balls 14 serve as input/output terminals of the package 10, and are used in the C5 method to mount and electrically connect the package to the PCB 16 in a plurality of solder connections 18, as illustrated in FIG. 3. The PCB 16 typically includes one or more layers of rigid fiberglass and copper sheets laminated together in a sandwich, but is not necessarily limited to such construction.

In both the C4 and C5 methods, the solder balls 14 are typically "reflowed" to a corresponding pad or land on the top surface 22 of the substrate 16, respectively, i.e., the device 10 is placed on the substrate 16, and both are then heated, e.g., in a conveyor oven, to the melting point of the solder, causing the solder balls 14 to melt and form the solder connections 18 between the device and substrate, as illustrated in FIG. 3.

The conventional method and apparatus for reinforcing the solder connections 18 between the device 10 and the substrate 16 against the stresses induced in them with bending and flexure of the substrate, are illustrated in FIG. 3. In the conventional method, the narrow space between the bottom surface 20 of the device 10 and the top surface 22 of the substrate 16 is filled with a quantity of a low-viscosity epoxy resin out to the peripheral edges 26 of the bottom surface of the device. The epoxy is then cured to form a solid, rigid epoxy structure 24 that occupies the interstitial spaces in the array of solder connections 18 between the device 10 and the substrate 16.

The rigid epoxy structure 24 serves to stiffen the device 10 and the substrate 16 locally against bending and the stresses imposed in the solder connections 18 as a result thereof. While this method functions satisfactorily to reduce the stresses in the solder connections 18, the technique is relatively complex and un-suitable to a typical surface mount assembly line, especially since the packages 10 must be underfilled one at a time before curing.

A novel apparatus for reliably reinforcing the solder connections 18 between a die or semiconductor package 10 and a substrate 16 in accordance with the present invention is illustrated in the top plan and side elevation views of FIGS. 4 and 5, respectively. In the exemplary embodiment illustrated, the apparatus comprises a rigid, rectangular ring, or frame 1 having a central opening 2 through it. The frame 1 has a planar top surface 3, a bottom surface 4 opposite and parallel to the top surface, and a controlled thickness T between the two surfaces (FIG. 5).

In terms of size, the frame 1 has about the same outline as that of the bottom surface 20 of the die or semiconductor package 10 in conjunction with which the frame is to be used, i.e., the length of the outer peripheral side walls 5 of the frame are about the same as or slightly smaller than the length and width of the die or package 10, while the central opening 2 has inner peripheral walls 6 that are sized and located so as to circumscribe the outermost pattern of lands or solder balls 14 on the bottom surface 20 of the die or package with a slight clearance, as described below.

The thickness T of the frame 1 is equal to the desired final height of the solder connections 18 between the device 10 and the substrate 16. Thus, for supporting a die 10 over a substrate 16, a typical frame 1 may be 320 mils (0.320 in., or 8 mm) on a side and 3 mils (0.075 mm) thick. For reinforcing the solder joints 18 between a semiconductor package 10 and a PCB 16, a typical frame 1 may be 480 mils (12 mm) on a side and 10 mils (0.25 mm) thick.

The frame 1 can be made of a variety of materials, e.g., a molded polymer. In one "reflowed" embodiment, the frame 1 is formed of a thermoplastic polymer that has a melting temperature that is about the same as that of the solder used in the solder connections 18. Alternatively, the frame 1 can be made of a thermosetting polymer, such as polyvinyl chloride ("PVC") or acrylonitrile butadiene styrene ("ABS"). To increase its strength and stiffness, the polymer can be reinforced with a fibrous material, e.g., fiberglass or polyester threads. Thus, one possible embodiment of the frame 1 can be die-stamped from a "pre-preg," i.e., a sheet of a fiberglass matrix that has been impregnated with a partially cured (i.e., a "B-Stage") epoxy resin. Because the B-stage epoxy is somewhat "tacky" until it is cured, it may be desirable to provide a temporary, peel-off sheet of protective plastic on both sides 3 and 4 of the frame 1 until it is ready for attachment.

In another embodiment, the frame 1 can be screened directly onto the bottom surface 20 of the die or package 10 using the same method and material that are currently used to form a "solder mask" (not illustrated) on the bottom surface of semiconductor packages 10, e.g., a silk screened acrylic polymer or epoxy resin.

In use, the top surface 3 of the frame 1 is attached to the bottom surface 20 of an associated die or semiconductor package 10 such that the outer side walls 5 of the frame are near or co-planar with the peripheral edges 26 of the bottom surface 20 of the die or package, and such that the inner peripheral walls 6 of the central opening 2 in the frame are positioned slightly outside of the input/output terminals, e.g., the solder balls 14, thereon (see FIGS. 6 and 7).

The frame 1 can be attached to the die or package 10 either before or after the solder balls 14 are attached thereto, and indeed, either before or after the die or package 10 is "singulated," i.e., separated, from a semiconductor wafer, or a strip or an array of identical packages, respectively. A pre-formed frame 1 can be easily and accurately attached to the bottom surface 20 of the die or package 10 with an adhesive, such as a heat curing epoxy, or alternatively, can be "attached" by screening it thereon, as described above, during or after the formation of a solder mask (not illustrated) on the bottom surface of the package.

After the frame 1 has been attached to the bottom surface 20 of the die or package 10, the die or package can be mounted on its associated substrate or PCB 16, as shown in FIG. 8. It is, of course, possible to mount the frame 1 to the substrate or PCB 16 as a separate item before the die or package 10 is mounted on the PCB 16. However, the typical surface mount line does not usually include facilities for this type of process, and hence, the more efficient and cost effective method may be to mount the frame 1 to the die or package 10 before the latter is mounted on the substrate or PCB 16, respectively, as described above.

As shown in FIG. 8, when the die or package 10 is mounted on its corresponding substrate or PCB 16, respectively, the bottom surface 4 of the frame 1 is attached to the top surface 22 of the substrate or PCB, e.g., with an adhesive. In one advantageous embodiment in which the solder balls 14 are reflowed to the substrate or PCB 16 to form the solder connections 18 as described above, the bottom surface 4 of the frame 1 is bonded to the top surface 22 of the PCB with a heat-curing adhesive such that the attachment of the frame and the reflow of the solder connections is accomplished simultaneously during the solder reflow process.

In yet another advantageous variation on the above embodiment, the frame 1 is made of a thermoplastic that has a melting temperature slightly greater than that of the solder in the solder balls 14. The thickness T of the frame 1 is made slightly less than the height of the solder balls 14, and equal to the final desired height of the solder connections 18. During the reflow process, the solder balls 14 melt and "collapse" under the weight of the die or package 10, thus lowering the molten bottom surface 4 of the frame 1 into bonding contact with the top surface 22 of the substrate or PCB 16.

When the frame 1 is attached to both the bottom surface 20 of a C4-connected die 10, or alternatively, a C5-connected semiconductor package 10 and the top surface 22 of a substrate or PCB 16, it surrounds the solder connections 18 with a rigid ring that acts to stiffen the package and the substrate locally against stresses in the solder connections caused by bending of the substrate, thereby eliminating any need for underfilling of the device.

Those of skill in the art will appreciate that many adaptations, variations, and modifications are possible in the method and apparatus of the invention without departing from its scope and spirit. For example, in some applications, it may be desirable to clean the space between the bottom surface 20 of the die or substrate 10 and the top surface 22 of the substrate or PCB 16, respectively, after the C4 or C5 solder connections have been made, e.g., to remove any residual flux therein. Alternatively,.it may be desirable to provide some means for relieving pressure in the space caused by, e.g., out-gassed byproducts, or large temperature fluctuations.

Accordingly, another possible embodiment of the frame 1 may include alternating lands 7 and recesses 8 in the top and bottom surfaces 3 and 4 thereof (shown by dotted lines in FIGS. 4 and 5), such that the frame 1 assumes a "castellated" appearance. The recesses 8 define openings through which cleaning solvents, plasmas, gasses and the like can flow into and out of the space inside the frame 1 containing the solder connections 18 for purposes of cleaning and/or pressure relief.

In view of the foregoing considerations, the scope of the present invention should not be limited by that of the particular embodiments described and illustrated herein, as these are merely exemplary in nature, but rather, should conform to that of the claims appended hereafter.

What is claimed is:

1. Apparatus for reinforcing solder connections between a bottom surface of a semiconductor device and an opposing, top surface of a substrate, the apparatus comprising:

a rigid frame exclusively between the bottom surface of the semiconductor device and the top surface of the substrate, the frame having an outer wall defining an outer perimeter and an inner wall defining a central opening therethrough, a top surface, a bottom surface opposite to the top surface, and a thickness between the top and bottom surfaces, the outer perimeter of the frame being the same as or smaller than an outer perimeter of the semiconductor device, the central opening being sized to circumscribe the solder connections between the device and the substrate, and the thickness being equal to a height of the solder connections between the device and the substrate.

2. The apparatus of claim 1, wherein the solder connections comprise a C4 or a C5 solder connection.

3. The apparatus of claim 1, wherein the semiconductor device comprises a semiconductor die or a semiconductor package.

4. The apparatus of claim 3 wherein the semiconductor package comprises a BGA, an LCC, or an LGA package.

5. The apparatus of claim 1, wherein the substrate comprises a flexible resin tape, a rigid fiberglass and metal sheet laminate, a ceramic coupon, or a metal lead frame.

6. The apparatus of claim 1, wherein the frame comprises a polymer.

7. The apparatus of claim 6, wherein the polymer comprises a thermosetting plastic.

8. The apparatus of claim 6, wherein the polymer comprises a thermoplastic.

9. The apparatus of claim 6, wherein the polymer comprises a B-stage epoxy.

10. The apparatus of claim 6, wherein the polymer is reinforced with a fibrous material.

11. The apparatus of claim 10, wherein the fibrous material comprises fiberglass.

12. The apparatus of claim 1, wherein the top surface of the frame is attached to the bottom surface of the semiconductor device at peripheral edges thereof and outside of a plurality of input/output terminals thereon.

13. The apparatus of claim 1, wherein the bottom surface of the frame is attached to the top surface of the substrate.

14. A semiconductor package, comprising:
a substrate having opposite first and second surfaces;
a semiconductor die having a first surface mounted in spaced opposition to the first surface of the substrate;
connecting means for electrically connecting corresponding portions of the respective first surfaces of the substrate and the die to each other; and,
reinforcing means for rigidly connecting only a peripheral portion of the first surface of the die to a corresponding portion of the first surface of the substrate.

15. The semiconductor package of claim 14, wherein the reinforcing means comprises a ring extending around a periphery of the first surface of the die and between the respective first surfaces of the die and the substrate.

16. The semiconductor package of claim 15, wherein the ring includes at least one discontinuity with at least one of the respective first surfaces of the die and the substrate.

17. The semiconductor package of claim 15, further comprising a second ring extending around a periphery of the second surface of the substrate.

18. In a semiconductor package of a type having a surface mountable in spaced opposition to and electrical connection with a surface of a PCB, the improvement in combination therewith comprising first reinforcing means for rigidly connecting only a peripheral portion of the surface of the package to a corresponding portion of the surface of the PCB.

19. The semiconductor package of claim 18, wherein the semiconductor package comprises a substrate and a semiconductor die having a surface mounted in spaced opposition to and in electrical connection with an opposing surface of the substrate, and further comprising second reinforcing means for rigidly connecting only a peripheral portion of the surface of the die to a corresponding portion of the opposing surface of the substrate.

20. The semiconductor package of claim 18, wherein the surface of the package is mountable to and electrically connectable with the surface of the PCB with a C5 connection.

21. The semiconductor package of claim 19, wherein the semiconductor die is mounted to and electrically connected with the opposing surface of the substrate with a C4 connection.

22. The semiconductor package of claim 14, wherein the reinforcing means is disposed exclusively between the first surface of the semiconductor die and the first surface of the substrate outward of the connecting means and within an outer perimeter of the first surface of the substrate.

23. The semiconductor package of claim 15, wherein the entire ring is within a perimeter of the semiconductor die.

24. A semiconductor device, comprising:

a first surface with an outer perimeter and a plurality of solder connectors within said perimeter; and a ring having opposite top and bottom surfaces, an outer wall defining an outer perimeter of the ring, and an inner wall defining a central aperture of the ring, wherein the top surface of the ring is attached to the first surface, the solder connectors are within the central aperture of the ring, and the outer perimeter of the ring is fully within the outer perimeter of the first surface.

25. The semiconductor device of claim 24, wherein the semiconductor device is a flip chip.

26. The semiconductor device of claim 24, wherein the semiconductor device is a semiconductor package comprising a semiconductor die coupled to an interconnective substrate having said first surface.

* * * * *